(12) United States Patent
Hekmatshoartabari et al.

(10) Patent No.: US 11,374,572 B2
(45) Date of Patent: Jun. 28, 2022

(54) COMPLEMENTARY LOGIC CIRCUIT AND APPLICATION TO THIN-FILM HYBRID ELECTRONICS

(71) Applicant: International Business Machines Corporation, Armonk, NY (US)

(72) Inventors: Bahman Hekmatshoartabari, White Plains, NY (US); Ghavam G. Shahidi, Pound Ridge, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/659,845

(22) Filed: Oct. 22, 2019

(65) Prior Publication Data

US 2020/0052702 A1 Feb. 13, 2020

Related U.S. Application Data

(63) Continuation of application No. 15/269,618, filed on Sep. 19, 2016, now Pat. No. 10,566,976.

(51) Int. Cl.
*H03K 19/0185* (2006.01)
*G09G 3/20* (2006.01)

(52) U.S. Cl.
CPC ....... *H03K 19/018521* (2013.01); *G09G 3/20* (2013.01); *G09G 2300/0871* (2013.01); *G09G 2310/0267* (2013.01); *G09G 2310/0289* (2013.01)

(58) Field of Classification Search
CPC combination set(s) only.
See application file for complete search history.

(56) References Cited

U.S. PATENT DOCUMENTS

| 4,929,884 | A | * | 5/1990 | Bird | G05F 3/24 |
|---|---|---|---|---|---|
| | | | | | 257/E27.064 |
| 5,399,920 | A | * | 3/1995 | Van Tran | H03K 19/01721 |
| | | | | | 326/83 |
| 5,952,847 | A | * | 9/1999 | Plants | H03K 19/018521 |
| | | | | | 326/80 |
| 6,940,333 | B2 | * | 9/2005 | Chiu | H03K 19/018521 |
| | | | | | 326/80 |
| 2001/0017609 | A1 | | 8/2001 | Okumura | |
| 2004/0160258 | A1 | * | 8/2004 | Tobita | G09G 3/3688 |
| | | | | | 327/333 |
| 2007/0216299 | A1 | | 9/2007 | Park | |
| 2008/0055946 | A1 | * | 3/2008 | Lesso | H02M 3/33561 |
| | | | | | 363/63 |
| 2010/0225243 | A1 | * | 9/2010 | Chen | G09G 3/3696 |
| | | | | | 315/291 |

(Continued)

OTHER PUBLICATIONS

United States Notice of Allowance dated Oct. 8, 2019, in U.S. Appl. No. 15/269,618.

(Continued)

*Primary Examiner* — Shaheda A Abdin
(74) *Attorney, Agent, or Firm* — L. Jeffrey Kelly, Esq.; McGinn I.P. Law Group, PLLC.

(57) ABSTRACT

A complementary circuit, including a logic unit which includes pull-up depletion-mode MOS transistors and pull-down depletion-mode MOS transistors and a level shifting circuit coupled to the logic unit.

17 Claims, 13 Drawing Sheets

(56) References Cited

U.S. PATENT DOCUMENTS

| | | | |
|---|---|---|---|
| 2012/0068207 A1* | 3/2012 | Hata | H01L 27/15 |
| | | | 257/94 |
| 2013/0221368 A1 | 8/2013 | Oraw | |
| 2014/0015601 A1* | 1/2014 | Lee | G11C 5/147 |
| | | | 327/541 |
| 2015/0171833 A1* | 6/2015 | Pi | H03K 3/012 |
| | | | 327/109 |
| 2016/0247927 A1* | 8/2016 | Nomura | H01L 29/78618 |

OTHER PUBLICATIONS

United States Office Action dated Feb. 21, 2019, in U.S. Appl. No. 15/269,618.
United States Office Action dated Dec. 10, 2019, in U.S. Appl. No. 15/269,618.
United States Office Action dated Jul. 12, 2018, in U.S. Appl. No. 15/269,618.
United States Office Action dated Mar. 20, 2018, in U.S. Appl. No. 15/269,618.
United States Office Action dated Jan. 8, 2018, in U.S. Appl. No. 15/269,618.
Mel, et al. "The NIST Definition of Cloud Computing". Recommendations of the National Institute of Standards and Technology. Nov. 16, 2015.

* cited by examiner

FIG. 1A
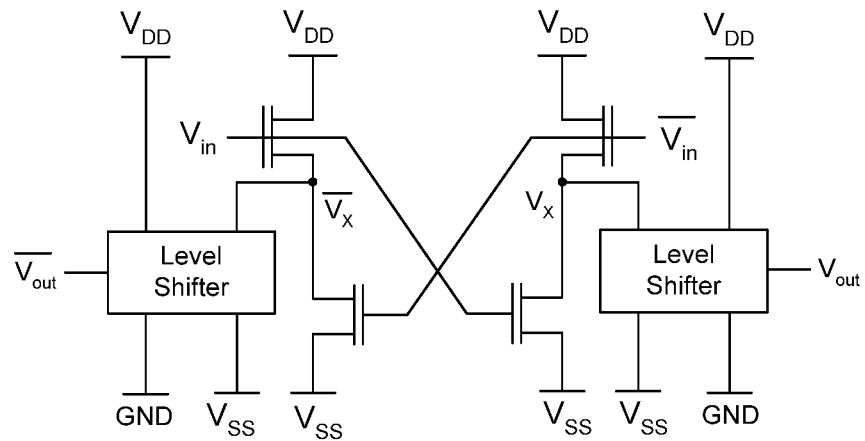
FIG. 1B
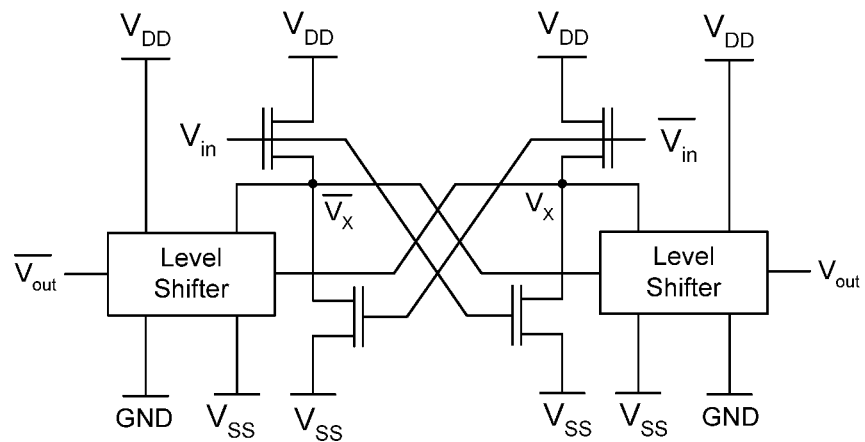
FIG. 1C
| $V_{in}$ | $\overline{V_{in}}$ | $V_x$ | $\overline{V_x}$ | $V_{out}$ | $\overline{V_{out}}$ |
|---|---|---|---|---|---|
| $V_L$ | $V_H$ | $\sim V_{DD}$ | $\sim V_{SS}$ | $\sim V_H$ | $\sim V_L$ |
| $V_H$ | $V_L$ | $\sim V_{SS}$ | $\sim V_{DD}$ | $\sim V_L$ | $\sim V_H$ |

| A | $\bar{A}$ | B | $\bar{B}$ | X | $\bar{X}$ | C | $\bar{C}$ |
|---|---|---|---|---|---|---|---|
| $V_L$ | $V_H$ | $V_L$ | $V_H$ | $\sim V_{DD}$ | $\sim V_{SS}$ | $\sim V_H$ | $\sim V_L$ |
| $V_H$ | $V_L$ | $V_L$ | $V_H$ | $\sim V_{SS}$ | $\sim V_{DD}$ | $\sim V_L$ | $\sim V_H$ |
| $V_L$ | $V_H$ | $V_H$ | $V_L$ | $\sim V_{SS}$ | $\sim V_{DD}$ | $\sim V_L$ | $\sim V_H$ |
| $V_H$ | $V_L$ | $V_H$ | $V_L$ | $\sim V_{SS}$ | $\sim V_{DD}$ | $\sim V_L$ | $\sim V_H$ |

| A | $\bar{A}$ | B | $\bar{B}$ | X | $\bar{X}$ | C | $\bar{C}$ |
|---|---|---|---|---|---|---|---|
| $V_L$ | $V_H$ | $V_L$ | $V_H$ | $\sim V_{SS}$ | $\sim V_{DD}$ | $\sim V_L$ | $\sim V_H$ |
| $V_H$ | $V_L$ | $V_L$ | $V_H$ | $\sim V_{SS}$ | $\sim V_{DD}$ | $\sim V_L$ | $\sim V_H$ |
| $V_L$ | $V_H$ | $V_H$ | $V_L$ | $\sim V_{SS}$ | $\sim V_{DD}$ | $\sim V_L$ | $\sim V_H$ |
| $V_H$ | $V_L$ | $V_H$ | $V_L$ | $\sim V_{DD}$ | $\sim V_{SS}$ | $\sim V_H$ | $\sim V_L$ |

COMPLEMENTARY LOGIC CIRCUIT AND APPLICATION TO THIN-FILM HYBRID ELECTRONICS

CROSS-REFERENCE TO RELATED APPLICATIONS

The present application is a Continuation Application of U.S. patent application Ser. No. 15/269,618, filed on Sep. 19, 2016, the entire contents of which are hereby incorporated by reference.

BACKGROUND

The present invention relates generally to a complementary circuit, and more particularly, but not by way of limitation, to a complementary circuit including at least one logic unit and a level shifting circuit.

In conventional thin-film transistor (TFT) technologies, only one TFT type (n-channel or p-channel) is available. This precludes the use of complementary metal-oxide-semiconductor (CMOS) circuits which are highly desired for reducing power consumption. In addition, in some emerging TFT technologies including a variety of metal-oxide and organic materials, the TFTs are depletion-mode/normally-on devices adding further complexity in designing low-power circuits. An important application for such circuitry is monolithic drivers for active-matrix displays which are highly desired for realizing displays with narrower edges (borders) for portable devices (e.g., cell phones and tablets), as well as flexible displays (e.g., which require at least one of the row or column drivers to be flexible thereby precluding the use of externally mounted rigid chips).

An exception to this limitation is low-temperature polysilicon (LTPS) which allows both n-channel and p-channel TFTs. LTPS also enables higher device and circuit performance due to higher TFT mobility. However, the TFT fabrication cost is significantly higher for LTPS. Further, the required TFT process temperatures (400-600° C.) are too high for low-cost glass or plastic substrates to be utilized.

Similar to conventional LTPS TFTs, complementary circuits may be realized by integrating n-channel and p-channel Heterojunction Field Effect Transistor (HJFET) devices. While the fabrication cost and complexity of HJFET is significantly lower than that of conventional LTPS TFTs (for either or both of channel types), the fabrication cost and complexity of integrating both n- and p-channel HJFET devices is higher than that of just n-channel or p-channel HJFET.

SUMMARY

Since, in hybrid electronic systems control signals may be available from externally mounted chips, this invention discloses a technique for implementing complementary TFT circuits without requiring two TFT channel types.

In an exemplary embodiment, the present invention can provide a complementary circuit, including a logic unit comprised of pull-up depletion-mode MOS transistors and pull-down depletion-mode MOS transistors having a single channel type and a level shifting circuit.

In another exemplary embodiment, the present invention can provide a system, including a heterojunction field-effect transistor (HJFET) device, a depletion-mode MOS device and a complementary circuit including a logic unit comprised of pull-up depletion-mode MOS transistors and pull-down depletion-mode MOS transistors having a single channel type and a level shifting circuit.

In a further exemplary embodiment, the present invention can provide an active matrix display, including a row driver implemented using a complementary circuitry including a logic unit comprised of pull-up depletion-mode MOS transistors and pull-down depletion-mode MOS transistors having a single channel type and a level shifting circuit.

Other details and embodiments of the invention will be described below, so that the present contribution to the art can be better appreciated. Nonetheless, the invention is not limited in its application to such details, phraseology, terminology, illustrations and/or arrangements set forth in the description or shown in the drawings. Rather, the invention is capable of embodiments in addition to those described and of being practiced and carried out in various ways and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

Aspects of the invention will be better understood from the following detailed description of the exemplary embodiments of the invention with reference to the drawings, in which:

FIGS. 1A-1C exemplarily depict inverter/buffer logic gates including at least one logic unit and a level shifter and a truth table thereof;

DETAILED DESCRIPTION

Figures 2A, 2B:
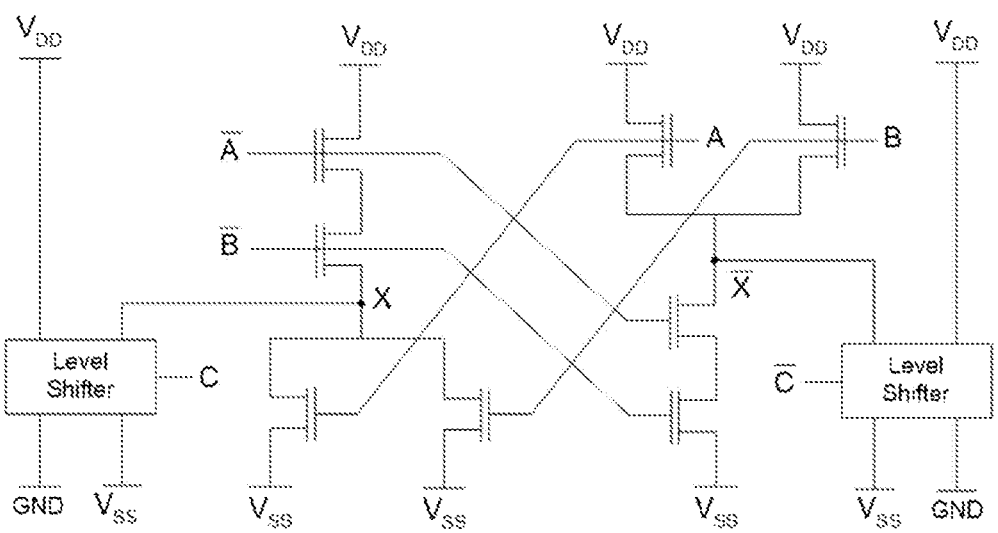
FIGS. 2A-2B exemplarily depict an NOR/OR logic gate including at least one logic unit and a level shifter and a truth table thereof.

The invention will now be described with reference to FIG. 1A-7G, in which like reference numerals refer to like parts throughout. It is emphasized that, according to common practice, the various features of the drawing are not necessarily to scale. On the contrary, the dimensions of the various features can be arbitrarily expanded or reduced for clarity.

With reference now to the example depicted in FIG. 1A and FIG. 1B, a complementary circuit is exemplarily depicted which includes of at least one logic unit including pull-up and pull-down depletion-mode metal-oxide-semiconductor (MOS) transistors having a single channel type (i.e., either an n-channel or a p-channel). The input signals applied to the gates of the pull-up transistors are complementary to that applied to the gates of the pull-down transistors.

As exemplary depicted in FIGS. 4A-5D, the complementary circuit includes a level shifting circuit including depletion-mode MOS transistors having a single channel type, and various diodes $D_1$-$D_4$ and capacitors $C_1$-$C_3$. The level shifting circuit shifts the output voltage range of the logic unit to about the same range as the input voltage range of the logic unit.

The complementary circuits depicted in FIGS. 1A-5D can include diodes that are implemented by the circuitry arrangement of HJFET devices. A diode may be implemented by using the gate terminal of an HJFET as the first terminal of the diode, and using either or both the drain and source terminals of the HJFET as the second terminal of the diode. When both the drain and source terminals are used, they may be electrically connected to each other to form a single terminal. Also, the capacitors can be implemented by the circuitry arrangement of depletion mode MOS devices. A capacitor can be implemented by using the gate terminal of a depletion mode MOS transistor as the first terminal of the capacitor, and using either or both the drain and source terminals of the depletion mode transistor as the second terminal of the capacitor. When both the drain and source terminals are used, they may be electrically connected to each other to form a single terminal. However, a capacitor also can be formed monolithically from two (2) metal layers and at least one dielectric layer (i.e., an MIM capacitor), which may also include one or more layers of a doped semiconductor (e.g., a-Si:H). Further, the depletion-mode MOS and HJFET devices can be monolithically integrated (e.g. using the process examples as in the co-pending U.S. patent application Ser. No. 15/266,414).

It is noted that the invention can include an active matrix display with a row driver implemented using the complementary circuitry depicted in FIGS. 1A-5D and an HJFET backplane where the row driver and the HJFET backplane are monolithically integrated (e.g. using the process examples as in the co-pending U.S. patent application Ser. No. 15/266,414).

In one embodiment, an active matrix organic light-emitting diode (AMOLED) display can be disposed (implemented) on a flexible plastic substrate. The TFT backplane can include of HJFET devices enabling the high TFT stability required for driving the OLED. The row driver may include complementary circuits (e.g., as exemplarily depicted in FIGS. 1A-5D) which can be integrated monolithically with the backplane and the column driver CMOS chip can be attached to one side of the display panel.

With reference again to FIGS. 1A-1B, the MOS transistors are depletion-mode. The MOS transistors exemplarily depicted are n-channel but p-channel transistors could be used as well. Further, the complementary circuits in FIGS. 1A-1B are configured such that $V_H > V_{DD} - |V_T|$, $V_L < V_{SS} - |V_T|$ (note $V_T < 0$ for depletion-mode n-channel transistors).

In a preferred embodiment, $V_H = V_{DD}$. FIG. 1C exemplarily depicts a truth table for the inverters depicted in FIGS. 1A-1B. It is noted that a buffer could be realized by interchanging the output terminals of the invertor exemplarily depicted in FIGS. 1A-1B.

FIG. 2A exemplary depicts a complementary circuit of a NOR logic gate with FIG. 2B exemplarily depicting the truth table for the complementary circuit of FIG. 2A.

Figures 3A, 3B:
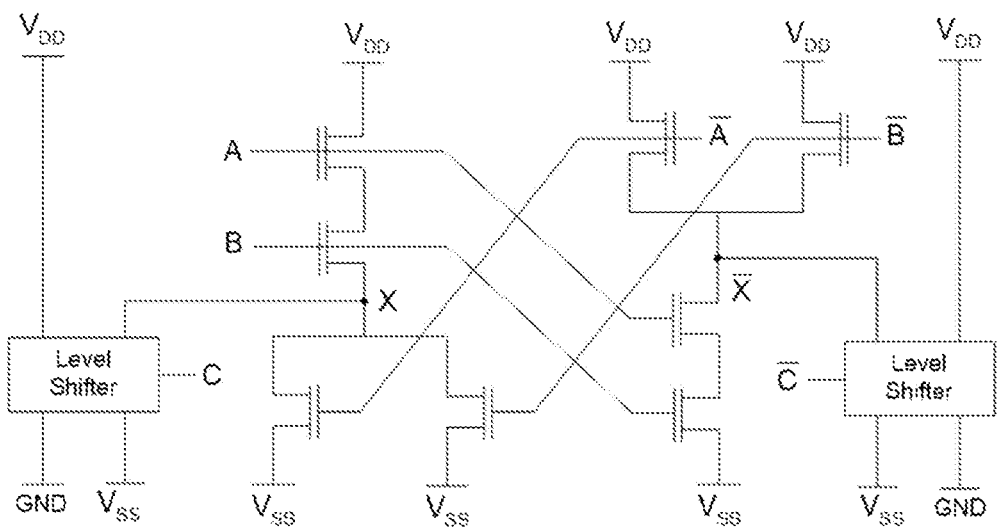
FIGS. 3A-3B exemplarily depict an AND/NAND logic gate including at least one logic unit and a level shifter and a truth table thereof.

FIG. 3A exemplary depicts a complementary circuit of an AND logic gate with FIG. 3B exemplarily depicting the truth table for the complementary circuit of FIG. 3A.

It is noted that in some embodiments, the level shifters use complementary inputs as exemplarily depicted in FIGS. 2A and 3A.

Figure 4:
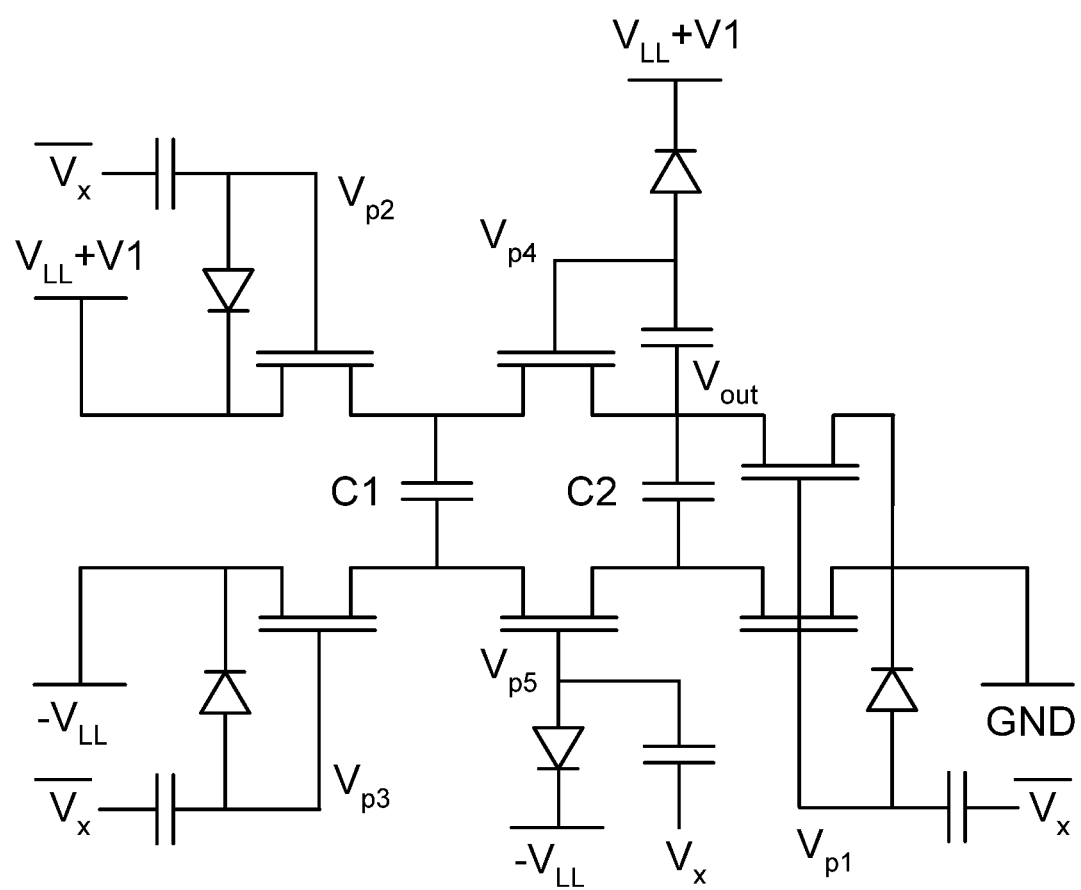
FIG. 4 exemplarily depicts a level shifter according to one exemplary embodiment.

With reference to FIG. 4, FIG. 4 exemplarily depicts a level shifter according to one embodiment. The MOS transistors exemplarily depicted are n-channel but p-channel transistors could be used as well. The capacitor/diode pairs connected to the gates of the input TFTs (i.e. all TFTs except the top-middle one) shift the DC levels of the input $V_x$ and $\nabla_X$ signals. Accordingly, the gate voltages of the input TFTs may be expressed as $V_{p1} = \nabla_X - V_{HH}$, $V_{p2} = \nabla_X - V_{LL} + V_1$, $V_{p3} = \nabla_X - V_{HH} - V_{LL}$, and $V_{p5} = V_x - V_{HH} - V_{LL}$. (Note the two TFTs on the right have the same gate voltage $V_{p1}$).

The basic operation of the level shifter according to FIG. 4A is as follows in two phases. In phase 1 (i.e. when $\nabla_X$ is high and $V_x$ is low), $C_1$ is charged to $V_1 + 2V_{LL}$ via the two TFTs on the left, while $C_2$ is discharged to 0V via the two TFTs on the right. In phase 2 (i.e. when $V_x$ is high and $\nabla_X$ is low), $C_1$ is connected to $C_2$ via the two TFTs in the middle. By preservation of electric charge, $C_2$ is charged to $(V_1 + 2V_{LL}) \times C_1/(C_1+C_2)$, or $(V_{LL}+V_1+|V_T|)$, whichever is lower. It is noted that when current drops to 0 (e.g., steady-state), $V_T$ is stored across the capacitor (references in FIG. 4) connected to the gate-source of the middle-top TFT.

Various variations of this type of circuit and level-shifting may be implemented based on FIG. 4. For example, capacitors $C_1$ and $C_2$ may be charged to other voltage levels, connected in series instead of in parallel, or charged in parallel and then connected in series (or vice versa).

In one exemplary embodiment, $V_{LL}$=4V, $V_1$=2V, $V_T$=−3.25V, $C_1$=10 pF, $C_2$=0.5 pF, and all other capacitors are set to 1 pF. The circuit of FIG. 4 converts the range of $V_x$ from (4-8V) to a predicted range of (0-9V). Given the finite channel conductance of the TFTs, the simulated HSPICE range is (~0.5-8.5V) as exemplarily depicted in FIG. 7A. A channel width-to-length ratio (W/L) of 4 was used for all the TFTs in this simulation. In the simulation examples provided throughout this disclosure (FIGS. 7A-7G) the simulated TFTs are n-channel, have a threshold voltage ($V_T$) of −3.25V, a gate oxide thickness of 50 nm, and channel sheet resistance ($R_{sh}$) of approximately 30 KΩ/□ at gate-to-source voltage ($V_{GS}$) of 0V and drain-to-source voltage ($V_{DS}$) of 0.1V. The said channel sheet resistance may be obtained e.g. by using a 50 nm-thick LTPS channel doped to a donor concentration ($N_D$) of approximately $5 \times 10^{17}$ cm$^{-3}$.

It is noted that $V_{LL}$ in FIG. 4 may be chosen to have approximately the same value as the low logic level $V_L$ e.g. of the logic gates of FIGS. 1A/1B, 2A and 3A. For example, if $V_{LL}=V_L$, then $V_{HH}=V_H$. However other values may be chosen for $V_{LL}$ as well and the general relationship is $V_{HH}-V_H=V_{LL}-V_L$. Also, in the said logic gates, a value of $V_L$ is close to but higher than $V_{SS}$, and $V_H$ is close to but lower than $V_{DD}$. Thus, in some embodiments, $V_{LL}$ is set as $V_{SS}$, i.e. using the same power supply for both $V_{SS}$ and $V_{LL}$. This may result in $V_{HH}$ being close to, but lower than $V_{DD}$. For example, $V_{DD}$=8V, and $V_{SS}$=$V_{LL}$=4V. $V_1$ has an arbitrary value, e.g. 2V.

FIGS. 5A to 5D exemplarily depict level shifters according to other embodiments of the invention. With reference generally to FIGS. 5A to 5D, the direct current (DC) level of $V_x$ (or $V_{out}$ in FIG. 5D) is down shifted and applied to the gate of the pull-up TFT. The gate of the pull-down TFT is connected to a DC voltage, e.g. ground (or optionally, as in FIG. 5C, DC level of $\nabla_x$ is down-shifted and applied to the gate of the pull-down TFT). A DC level of $V_x$ is down-shifted using $C_2/D_2$ and applied to the source of the pull-down TFT. The lower level of this signal is transferred to $V_{out}$ whereas its upper level is blocked. In some embodiments, the DC level of $V_x$ is optionally up-shifted using $C_3/D_3$ (e.g., FIG. 5B) or otherwise directly applied to the drain of the pull-up TFT. The upper level of this signal is transferred to $V_{out}$ whereas its lower level is blocked. The configuration of the circuit depicted in FIG. 5C can be advantageous to the circuit depicted in FIG. 5A in some embodiments because larger negative $V_{GS}$ may be available to turn-off (or reduce the off-current of) the pull-down TFT when the pull-up TFT is on. The configuration of the circuit depicted in FIG. 5D can be advantageous to the circuit depicted in FIG. 5A in some embodiments because the larger negative $V_{GS}$ may be available to turn-off (or reduce the off-current of) the pull-up TFT when the pull-down TFT is on.

It is noted that various combinations of the functions and/or components or cascading of the stages is possible of the circuits depicted in FIGS. 5A-5D.

Figure 5A:
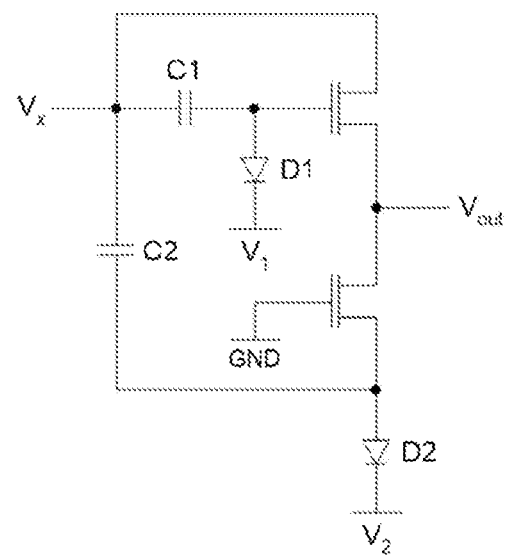
FIGS. 5A-5D exemplarily depict level shifters according to a second exemplary embodiment.
Figure 5B:
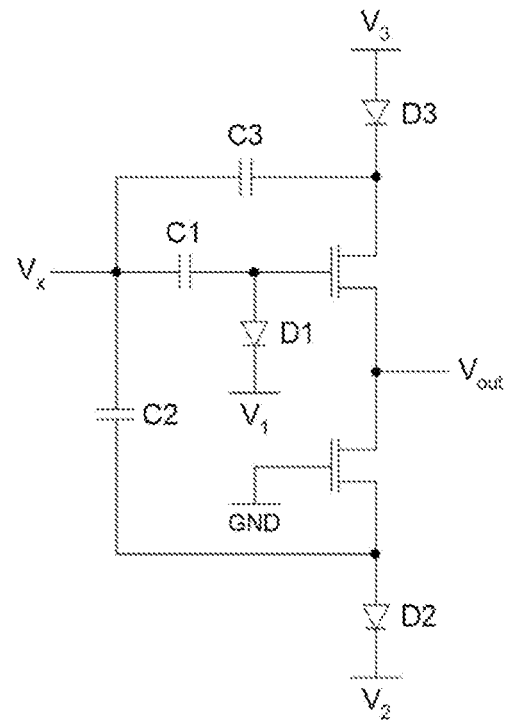
Figure 5C:
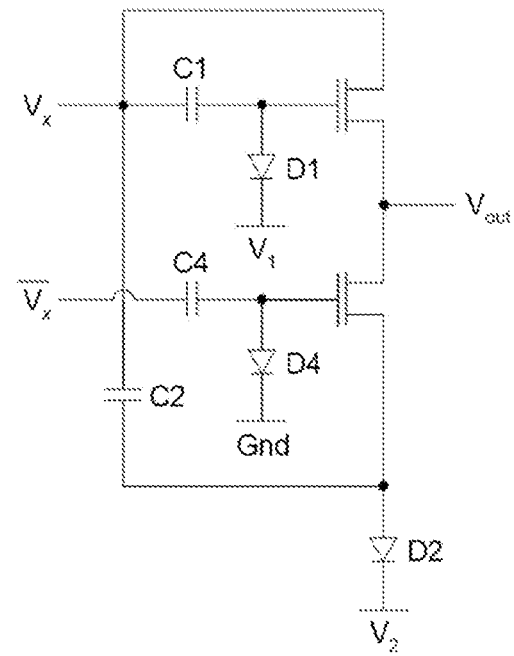
Figure 5D:
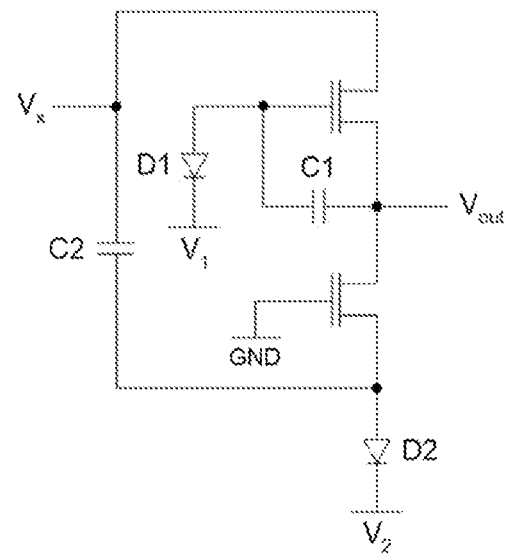
Figure 6:
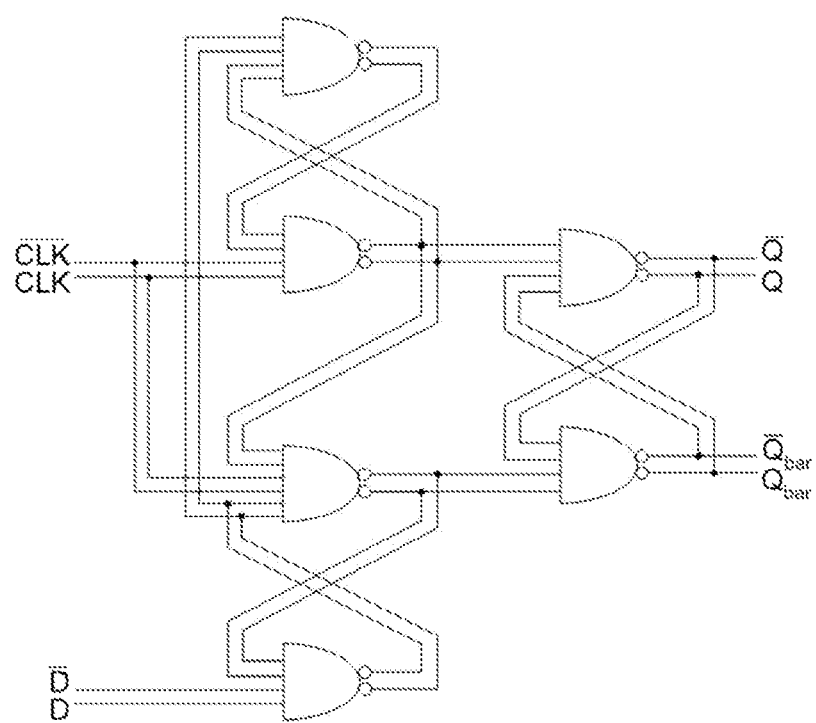
FIG. 6 exemplarily depicts a positive-edge-triggered D-Hip-Flop according to one exemplary embodiment.
Figure 7A:
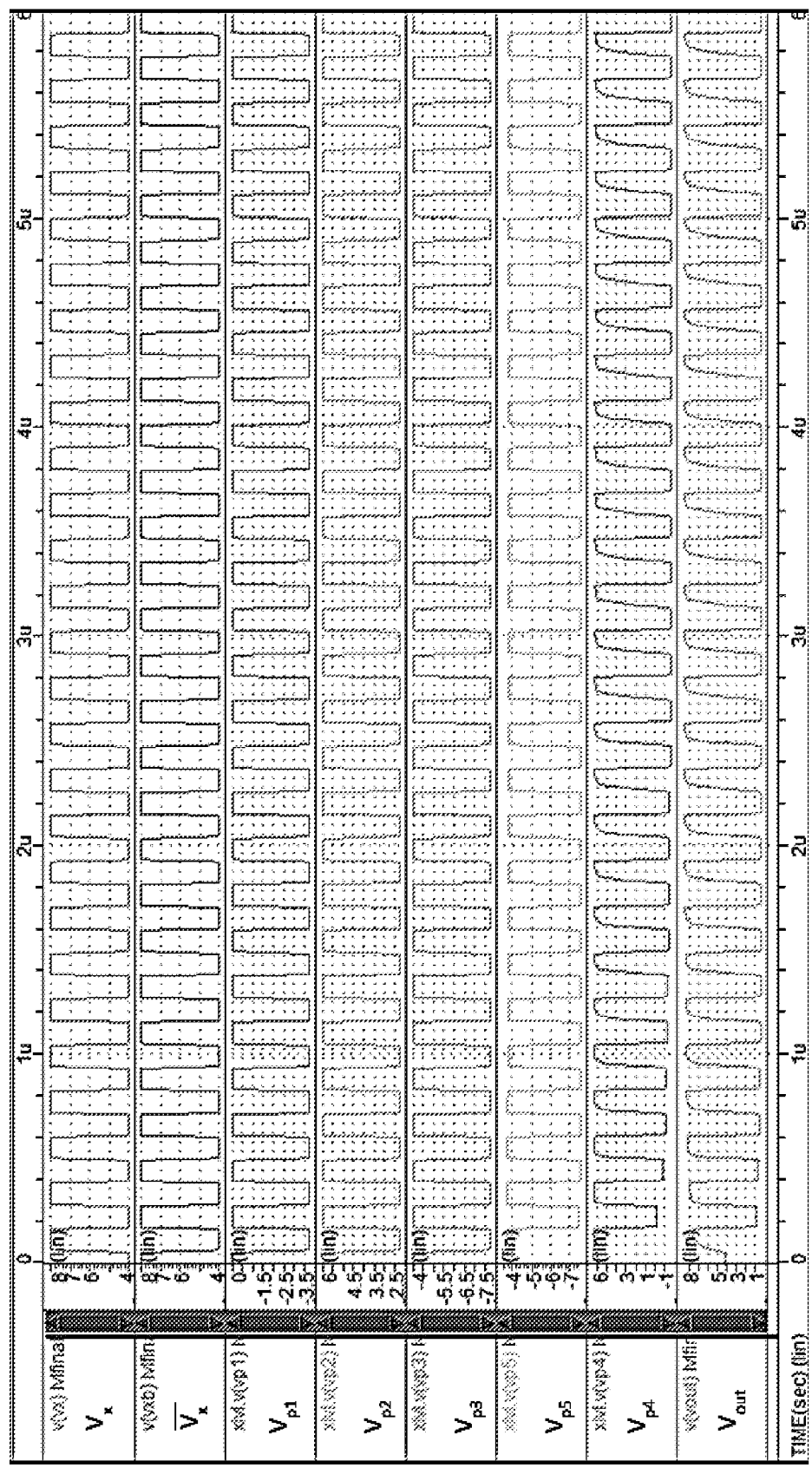
FIG. 7A exemplarily depicts a Hailey Simulation Program with Integrated Circuit Emphasis (HSPICE) simulation result of the level shifter according to FIGS. 4A-4B.
Figure 7B:
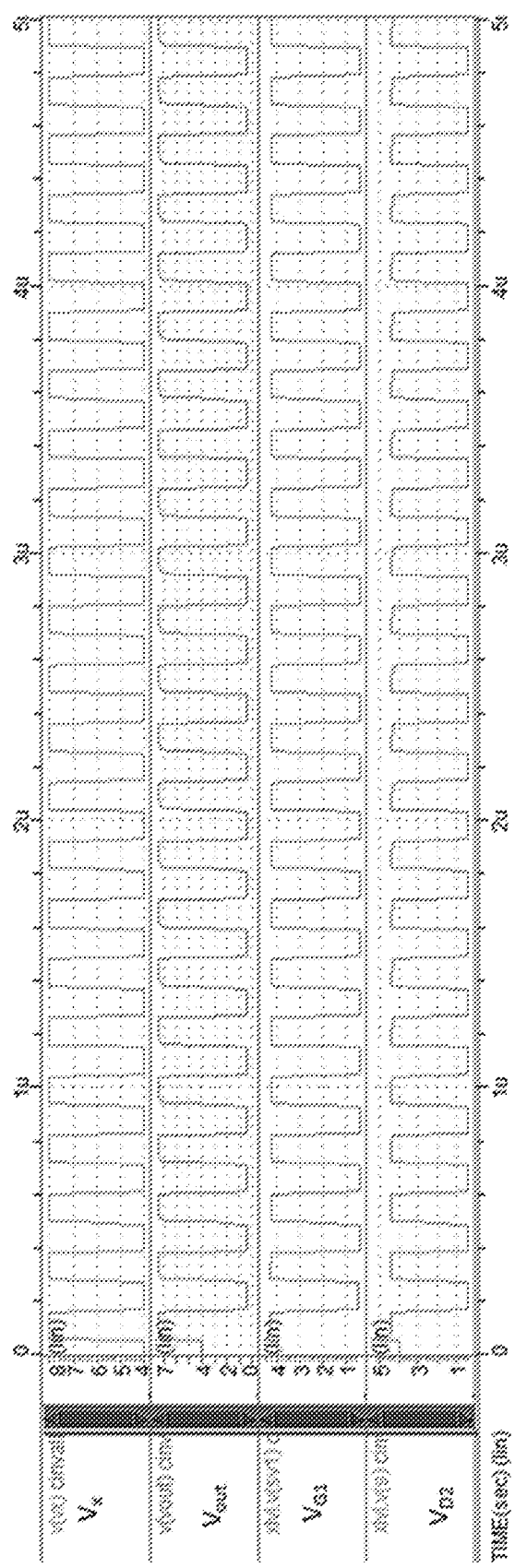
FIG. 7B exemplarily depicts an HSPICE simulation result of the level shifter according to FIG. 5A.
Figure 7C:
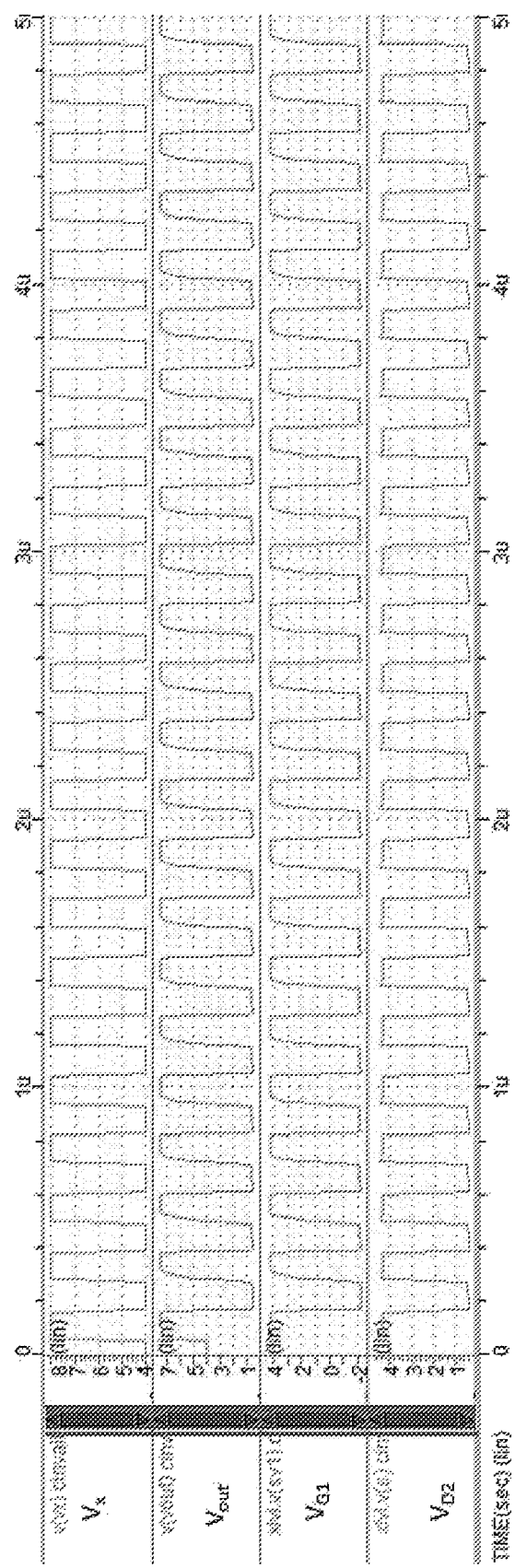
FIG. 7C exemplarily depicts an HSPICE simulation result of the level shifter according to FIG. 5D.
Figure 7D:
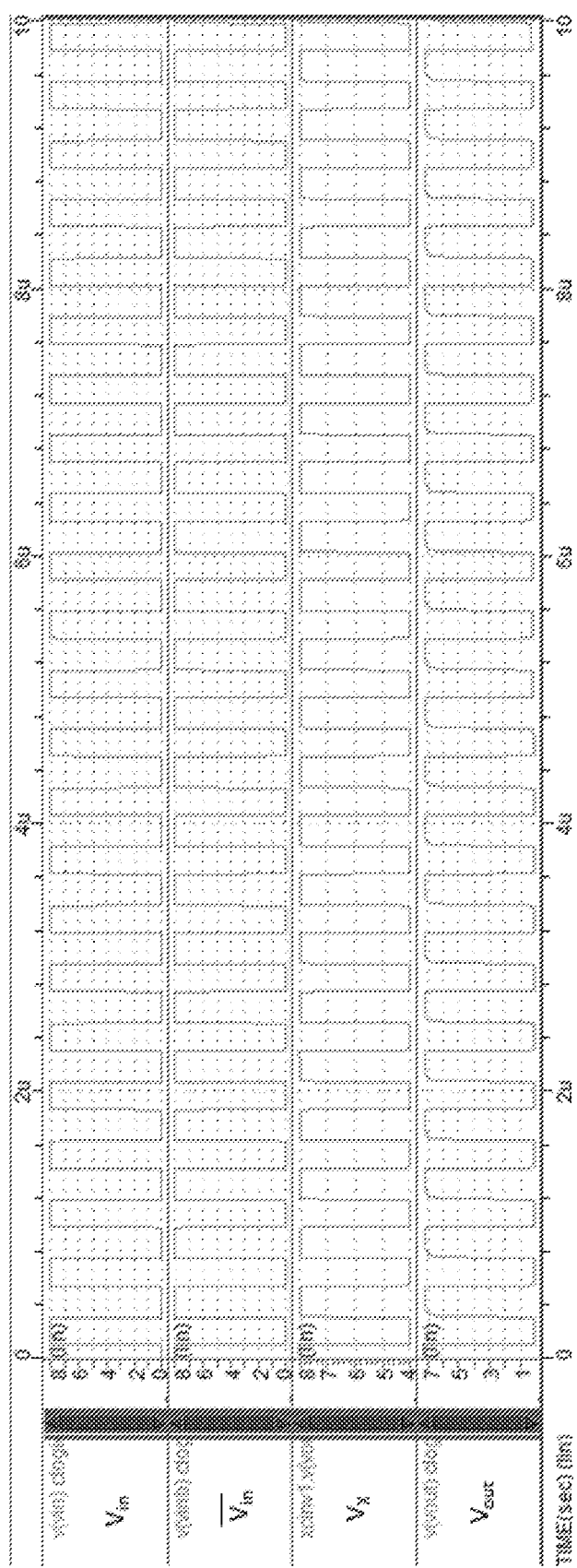
FIG. 7D exemplarily depicts an HSPICE simulation result of the inverter logic gate of FIG. 1A.
Figure 7E:
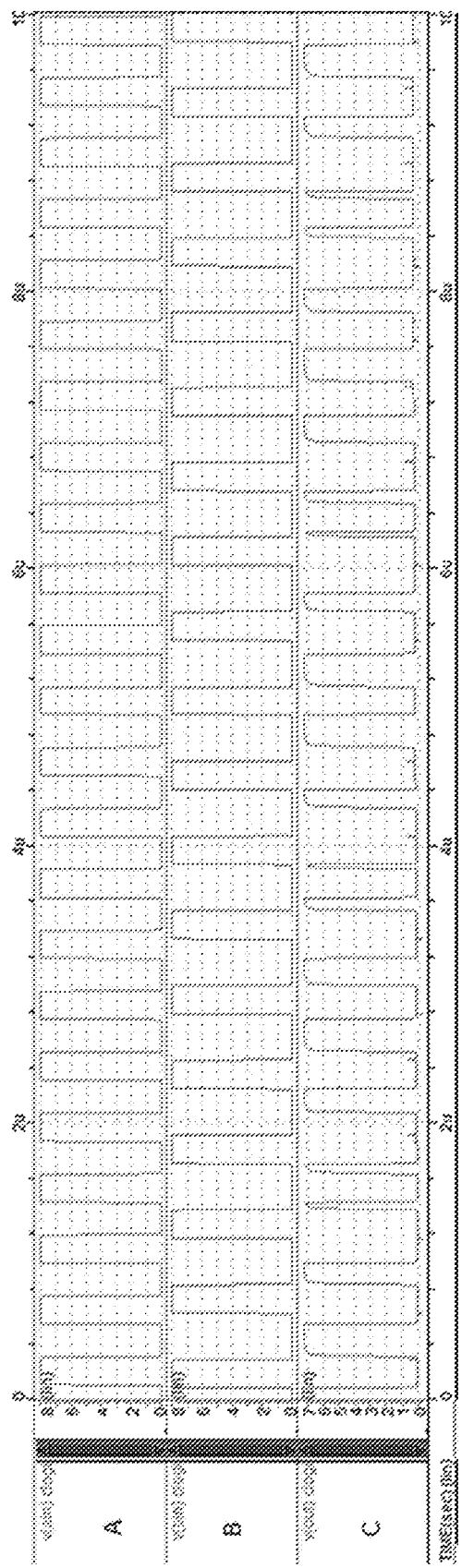
FIG. 7E exemplarily depicts an HSPICE simulation result of the NOR logic gate of FIG. 2A.
Figure 7F:
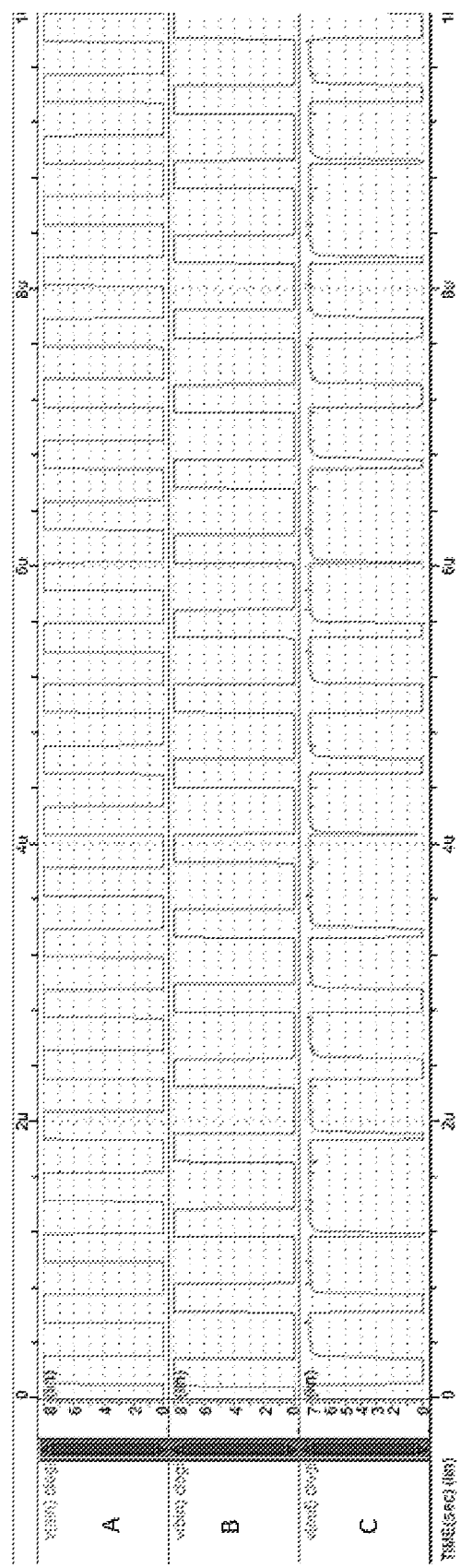
FIG. 7F exemplarily depicts an HSPICE simulation result of the NAND logic gate of FIG. 3A.
Figure 7G:
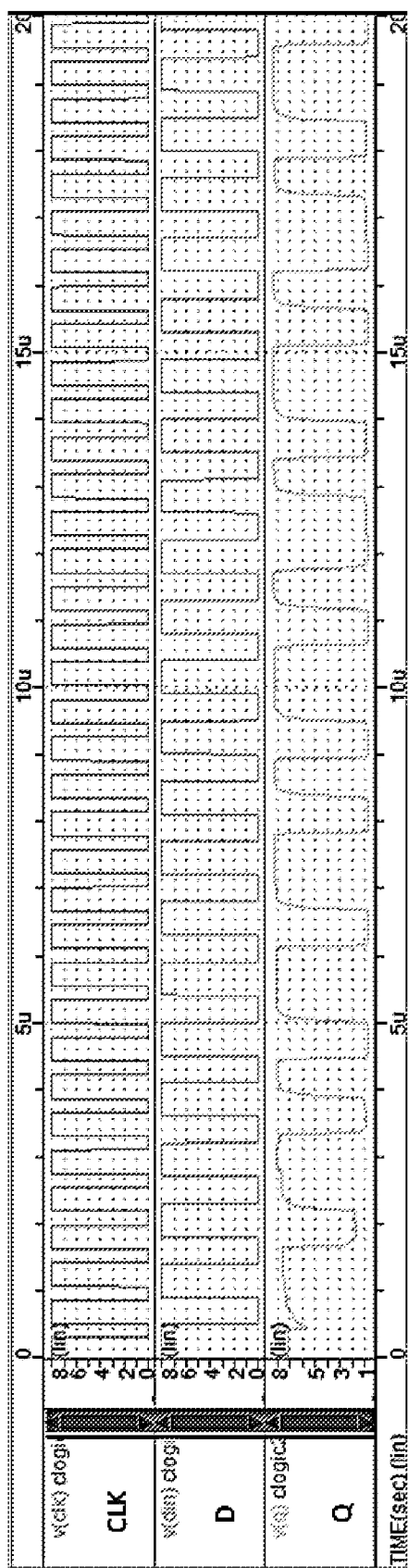
FIG. 7G exemplarily depicts an HSPICE simulation result of the positive-edge-trigger D-Flip-Flop circuit of FIG. 6.

Exemplary HSPICE simulation results of the level shifters according to FIGS. 5A and 5D are depicted in FIGS. 7B and 7C, respectively. For both simulations, $C_1$=1 pF, $C_2$=20 pF, $V_1$=4V, $V_2$=4V, and W/L=4 for the pull-down TFT. For the pull-up TFT, W/L=0.2 and 20 in the simulations of FIGS. 7B and 7C respectively. A small pull-up W/L ratio was used in the first simulation to reduce current flow through the pull-up TFT when the pull-down TFT is on; whereas a large W/L ratio was used to enhance the switching speed in the second simulation. In FIGS. 7B and 7C, $V_{G1}$ denotes the gate voltage of the pull-up TFT (which is equal to the anode voltage of $D_1$) and $V_{D2}$ denotes the anode voltage of $D_2$ (which is equal to the source voltage of the pull-down TFT). Exemplary HSPICE simulation results of the inverter, NOR and NAND gates according to FIGS. 1A, 2A and 3A are depicted in FIGS. 6D, 6E and 6F, respectively. The level shifter simulated in FIG. 7B was incorporated in the simulation of these logic gates.

FIG. 6 exemplarily depicts a positive-edge-triggered D-Hip-Flop according to one exemplary embodiment. The NAND logic gates employed in the construction of the D-Hip-Flop circuit may be implemented using the embodiment of FIG. 3A. As will be appreciated by those skilled in the art, the circuit construct of the D-Flip-Flop of FIG. 6 comprised of NAND logic gates based on the embodiment of FIG. 3A is the same as the circuit construct of a conventional CMOS D-Flip-Flop circuit comprised of conventional CMOS NAND gates, except that complementary input, output and intermediary signals are used for the operation of the D-Flop-Flop of FIG. 6; for example, the input signals of a conventional CMOS D-Flip-Flop with the same construct may include CLK and D whereas the input signals of the D-Flip-Flop of FIG. 6 may include CLK, $\overline{CLK}$, D and $\overline{D}$; and the output signals of a conventional CMOS D-Flip-Flop with the same construct may include Q and $Q_{bar}$ whereas the output signals of the D-Flip-Flop of FIG. 6 may include Q, $\overline{Q}$, $Q_{bar}$ and $\overline{Q_{bar}}$ (note Q is complementary to $Q_{bar}$, therefore $\overline{Q_{bar}} \approx Q$). Similarly, various conventional logic circuits known in the art may be implemented using the disclosed logic units as the building blocks of the circuit and providing complementary signals as described. In one example, D-Hip-Flops implemented according to FIG. 6 are cascaded to implement a shift register, which may be used as the row (gate) driver of an active-matrix light-emitting diode display. Such a shift register circuit may be fabricated monolithically with an HJFET backplane (e.g. using the process examples as in the co-pending U.S. patent application Ser. No. 15/266,414). Exemplary simulation results of a D-Flip-Flop according to FIG. 6 is given in FIG. 7G. The NAND gate simulated in FIG. 7F was incorporated in the simulation of the D-Hip-Flop of FIG. 7G. As noted, apart from the use of complementary signals, the simulated D-Flip-Flop provides the same functionality as that of a conventional CMOS D-Flip-Flop.

Thus, a complementary circuit as exemplarily depicted in FIGS. 1A to 5D including depletion-mode thin-film transistors having a single channel type and implemented with minimal standby (static) power can be provided thereby to reduce the manufacturing cost and capital equipment cost compared to the conventional LTPS TFT process. In addition, the number of mask steps may be reduced compared to the conventional LTPS process. Further, the process temperature may be reduced from 400-600° C. to 200° C. and below, compared to the conventional LTPS. The use of low cost and/or flexible substrates such as plastic and conventional glass is made possible without compromising the device performance and system-level performance. Also, device and system-level performance is enhanced (for a given power consumption), or the power consumption is reduced (for a given system performance), compared to the conventional LTPS TFT process.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Further, Applicant's intent is to encompass the equivalents of all claim elements, and no amendment to any claim of the present application should be construed as a disclaimer of any interest in or right to an equivalent of any element or feature of the amended claim.

What is claimed is:
1. A complementary circuit, comprising:
  a logic unit configured to provide a logic function and a digital operation, the logic unit comprising pull-up depletion-mode circuit MOS transistors and pull-down depletion-mode MOS transistors, the logic unit including a digital switch; and
  a level shifting circuit including diodes which are implemented by a circuitry arrangement of a heterojunction field-effect transistor (HJFET) device,
  wherein an input and an output of the level shifting circuit comprise complementary signals,
  wherein the depletion-mode MOS devices and the HJFET devices are monolithically integrated, wherein the logic unit and the level shifting circuit comprise a first capacitor and a second capacitor which are implemented by a circuitry arrangement of the depletion-mode MOS transistors, and wherein, the level shifter operates in a first phase and a second phase such that:
in the first phase:
the first capacitor is charged to a first value while the second capacitor is discharged; and
in the second phase:
the first capacitor is connected to the second capacitor and by preservation of charge, the second capacitor is charged to a predetermined value.

2. The complementary circuit of claim 1, wherein input signals applied to gates of the pull-up depletion-mode MOS transistors are complementary to input signals applied to gates of the pull-down depletion-mode MOS transistors.

3. The complementary circuit of claim 1, wherein the level shifting circuit comprises depletion-mode MOS transistors having a single channel conductivity type and at least one diode.

4. The complementary circuit of claim 1, wherein the level shifting circuit shifts an output voltage range of the logic unit to a same range as an input voltage range of the logic unit.

5. The complementary circuit of claim 1, wherein the level shifting circuit comprises diodes which are implemented by a circuitry arrangement of heterojunction field-effect transistor (HJFET) devices.

6. The complementary circuit of claim 1, wherein the level shifting circuit is coupled to the logic unit.

7. The complementary circuit of claim 1, wherein the pull-up and pull-down transistors include a single channel conductivity type including negative threshold voltages.

8. The complementary circuit of claim 1, wherein the pull-up and pull-down transistors are both n-channel or are both p-channel.

9. The complementary circuit of claim 1, wherein, in the first phase, $\nabla_X$ is a first value and $V_x$ is a second value less than the first value, and
wherein, in the second phase, the second value of $V_x$ is greater than the first value of $\nabla_X$.

10. A system, comprising:
a circuit comprising a heterojunction field-effect transistor (HJFET) device and a depletion-mode MOS device; and
a complementary circuit coupled to the circuit, the complementary circuit including:
a logic unit configured to provide a logic function and a digital operation, the logic unit comprising pull-up depletion-mode MOS transistors and pull-down depletion-mode MOS transistors, the logic unit including a digital switch; and
a level shifting circuit including diodes which are implemented by a circuitry arrangement of the heterojunction field-effect transistor (HJFET) device,
wherein an input and an output of the level shifting circuit comprise complementary signals,
wherein the depletion-mode MOS devices and the HJFET devices are monolithically integrated,
wherein the logic unit and the level shifting circuit comprise a first capacitor and a second capacitor which are implemented by a circuitry arrangement of the depletion-mode MOS transistors, and
wherein, the level shifter operates in a first phase and a second phase such that:
in the first phase:
the first capacitor is charged to a first value while the second capacitor is discharged; and
in the second phase:
the first capacitor is connected to the second capacitor and by preservation of charge, the second capacitor is charged to a predetermined value.

11. The system of claim 10, wherein input signals applied to gates of the pull-up depletion-mode MOS transistors are complementary to input signals applied to gates of the pull-down depletion-mode MOS transistors.

12. The system of claim 10, wherein the level shifting circuit comprises depletion-mode MOS transistors having a single channel conductivity type and at least one diode.

13. The system of claim 10, wherein the level shifting circuit shifts an output voltage range of the logic unit to approximately a same range as an input voltage range of the logic unit.

14. The system of claim 10, wherein the level shifting circuit comprises diodes which are implemented by a circuitry arrangement of heterojunction field-effect transistor (HJFET) devices.

15. The system of claim 10, wherein the level shifting circuit shifts an output voltage range of the logic unit to a same range as an input voltage range of the logic unit.

16. The system of claim 10, wherein the level shifting circuit is coupled to the logic unit.

17. An active matrix display, comprising:
a row driver implemented using a complementary circuit, the complementary circuit including:
a logic unit configured to provide a logic function and a digital operation, the logic unit comprising pull-up depletion-mode MOS transistors and pull-down depletion-mode MOS transistors, the logic unit including a digital switch; and
a level shifting circuit including diodes which are implemented by a circuitry arrangement of a heterojunction field-effect transistor (HJFET) device,
wherein an input and an output of the level shifting circuit comprise complementary signals,
wherein the depletion-mode MOS devices and the HJFET devices are monolithically integrated,
wherein the logic unit and the level shifting circuit comprise a first capacitor and a second capacitor which are implemented by a circuitry arrangement of the depletion-mode MOS transistors, and
wherein, the level shifter operates in a first phase and a second phase such that:
in the first phase:
the first capacitor is charged to a first value while the second capacitor is discharged; and
in the second phase:
the first capacitor is connected to the second capacitor and by preservation of charge, the second capacitor is charged to a predetermined value.

\* \* \* \* \*